United States Patent [19]
Kudou et al.

[11] Patent Number: 4,861,422
[45] Date of Patent: Aug. 29, 1989

[54] METHOD OF MANUFACTURING SHADOW MASK AND APPARATUS

[75] Inventors: Makoto Kudou; Katsumi Ichikawa, both of Kumagaya, Japan

[73] Assignee: Kabushiki Kaisha Toshiba, Kawasaki, Japan

[21] Appl. No.: 195,625

[22] Filed: May 18, 1988

[30] Foreign Application Priority Data

May 19, 1987 [JP] Japan .................................. 62-120142

[51] Int. Cl.$^4$ ............................ C23F 1/02; B44C 1/22
[52] U.S. Cl. .................................... 156/640; 156/644; 156/651; 156/654; 156/661.1; 156/345; 134/34; 430/23
[58] Field of Search ............... 156/640, 644, 651, 656, 156/659.1, 661.1, 664, 345, 654; 430/23, 312, 313, 316, 318; 313/402, 403, 408; 252/79.1, 79.5; 134/34

[56] References Cited

U.S. PATENT DOCUMENTS 4,124,437 11/1978 Bond et al. ...................... 156/644 X
4,662,984 5/1987 Ohtake et al. .................. 156/644 X
4,689,114 8/1987 Ohtake et al. ....................... 156/644

Primary Examiner—William A. Powell
Attorney, Agent, or Firm—Cushman, Darby & Cushman

[57] ABSTRACT

A method of manufacturing a shadow mask, comprising the steps of forming a first resist pattern having a large number of openings on one major surface of a thin metal plate and a second resist pattern on the other major surface, the second resist pattern having a large number of openings with an opening size larger than that of the first resist pattern, etching the thin metal plate surface having the first resist pattern to form first recesses, removing the first resist pattern, forming an etching-resistive layer on the thin metal plate surface having the first recesses to fill the first recesses, etching the thin metal plate surface having the second resist pattern to form second recesses which have a size larger than that of the first recesses and communicate with the first recesses, treating and swelling the etching-resistive layer with an alkali solution, spraying warm water to the etching-resistive layer to remove the etching-resistive layer, and removing the second resist pattern.

15 Claims, 5 Drawing Sheets

F I G. 4A
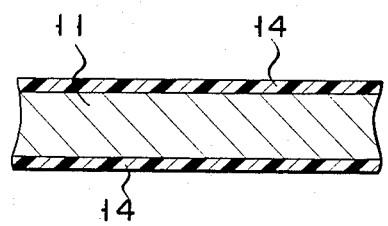
F I G. 4B
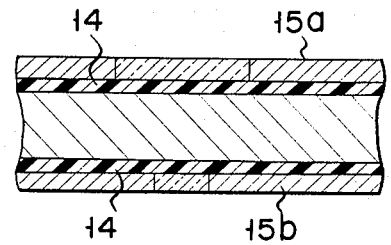
F I G. 4C
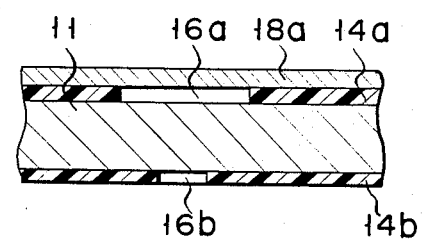
F I G. 4D
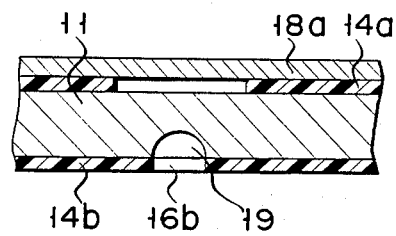
F I G. 4E
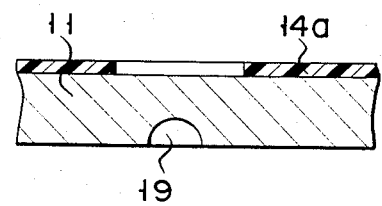

METHOD OF MANUFACTURING SHADOW MASK AND APPARATUS

BACKGROUND OF THE INVENTION

1. Field of the Invention

The present invention relates to a method of manufacturing a shadow mask for a color picture tube and, more particularly, to a method of manufacturing a shadow mask for a color picture tube in which both surfaces of a thin metal plate are etched in separate steps to prepare to the shadow mask.

2. Description of the Prior Art

A shadow mask is mounted in a color picture tube to oppose a phosphor screen of three-color phosphors mounted on the inner surface of a panel. As shown in FIG. 1, this shadow mask comprises thin metal plate 1 having a large number of apertures 2 in a predetermined pattern so as to select electron beams incident on the phosphor screen. In order to reduce the electron beams impinging on the inner walls of apertures 2 and reflected toward the phosphor screen, an opening size of the apertures on the phosphor screen side is larger than that on the electron gun side.

A conventional shadow mask for a color picture tube used in a television set is manufactured by a method shown in FIGS. 2A to 2E.

As shown in FIG. 2A, a photoresist is applied to both cleaned surfaces of thin metal plate 1 and is dried to form resist films 4a and 4b. As shown in FIG. 2B, negative patterns 5a and 5b having aperture patterns of the shadow mask are brought into tight contact with resist films 4a and 4b, respectively, and exposure is performed. The exposed films are developed and the nonsensitized portions are removed, thereby forming resist patterns 4a and 4b shown in FIG. 2C. Reference numeral 6a denotes a large-sized exposed portion of thin metal plate 1; and 6b, a small-sized exposed portion of thin metal plate 1.

Both surfaces of thin metal plate 1 are simultaneously etched using resist films 4c and 4d as etching-resistive masks, thereby forming aperature 2 shown in FIG. 2D. Thereafter, resist patterns 4c and 4d are removed to obtain a shadow mask shown in FIG. 2D.

According to the above method, when the opening size d of aperture 2 on the electron gun side is decreased, its precision is degraded. It is difficult to obtain with excellent reproducibility a highly fine and precise shadow mask having smaller opening size d than the plate thickness for a display color picture tube requiring a fine and precise image.

A method of manufacturing such a highly fine and precise shadow mask, therefore, is exemplified by a two-step etching process shown in FIGS. 3A to 3F and disclosed in U.S. Pat. No. 4,689,114.

In the same manner as in steps shown in FIGS. 2A to 2C, resist films 4a and 4b are formed and negative patterns 5a and 5b are brought into tight contact therewith. Exposure and development are performed to from resist patterns 4c and 4d. As shown in FIG. 3A, protective film 8a is adhered to the surface of resist pattern 4c to protect etching the surface for the large opening size. In this state, resist pattern 4d for etching the surface for the small opening size is located on the lower side, and etching is performed to form small recess 9 (first etching). As shown in FIG. 3B, resist pattern 4d is removed. As shown in FIG. 3C, etching-resistive resin is coated on the thin metal plate surface with small recess 9 to form etching-resistive layer 10 so as to fill small recess 9. In addition, protective film 8b is adhered to etching-resistive layer 10.

In this state, resist pattern 4c is caused to face down and the thin metal plate surface with resist pattern 4c is etched to form large recess 11 which reaches the bottom of small recess 9, as shown in FIG. 3D (second etching). As shown in FIG. 3E, protective film 8b is removed, and resist pattern 4c and etching-resistive layer 10 are removed by an alkali solution, thereby obtaining a shadow mask shown in FIG. 5F.

According to the method shown in FIGS. 3A to 3F, etching-resistive layer 10 cannot often be removed completely due to its adhesion. In addition, a large amount of material of removed etching-resistive layer 10 is mixed in a resist film removing chamber or an alkali solution tank. This material is attached to aperture 2 to cause clogging. As a large amount of material of etching-resistive layer 10 is mixed in the alkali solution after the treatment, it is difficult to reproduce and reuse the alkali solution.

SUMMARY OF THE INVENTION

It is an object of the present invention to provide a method of manufacturing a shadow mask, wherein an etching-resistive layer can be satisfactorily removed, clogging of apertures can be prevented, and an alkali solution for removing the resist film can be reused.

According to the present invention, there is provided a method of manufacturing a shadow mask, comprising the steps of forming a first resist pattern having a large number of openings on one major surface of a thin metal plate and a second resist pattern on the other major surface, the second resist pattern having a large number of openings with an opening size different from that of the first resist pattern, etching the thin metal plate surface having the first resist pattern to form first recesses, removing the first resist pattern, forming an etching-resistive layer on the thin metal plate surface having the first recesses, etching the thin metal plate surface having the second resist pattern to form second recesses which have a size different from that of the first recesses and communicate with the first recesses, treating and swelling the etching-resistive layer with an alkali solution, spraying warm water to the etching-resistive layer to remove the etching-resistive layer, and removing the second resist pattern.

The opening size of the first resist pattern may be smaller than that of the second resist pattern. In this case, the first recesses are smaller than the second recesses.

The etching-resistive layer may be formed of any material if it has an anti-etching property. Examples of such a material are epoxy resin, acrylic resin, a photoresist, and the like.

Examples of the alkali solution for swelling the etching-resistive layer are an NaOH solution, and NaOH solution containing a surfactant or inhibitor.

The temperature of the alkali solution for swelling the etching-resistive layer preferably falls within the range of 80° to 110° C. and more preferably 88° to 98° C. The pressure of the alkali solution applied to the etching-resistive layer preferably falls within the range of 1.5 kg/cm$^2$ or less and more preferably 0.5 to 1.0 kg/cm$^2$.

The temperature of warm water for removing the etching-resistive layer preferably falls within the range of 20° to 70° C. and more preferably 30° to 50° C. The pressure of warm water sprayed to the etching-resistive layer preferably falls within the range of 0.5 to 3 kg/cm² and more preferably 1.0 to 2.0 kg/cm².

The direction of warm water sprayed to the etching-resistive layer is preferably inclined with respect to the surface of the etching-resistive layer.

According to the method of the present invention, after the etching-resistive layer is treated and swelled with the alkali solution, warm water is sprayed to the etching-resistive layer, and the etching-resistive layer can be easily and properly removed. In a conventional process, the etching-resistive layer and the second resist pattern are simultaneously removed by an alkali solution. However, according to the present invention, the etching-resistive layer and the second resist pattern are removed in separate steps. For this reason, clogging of the aperture by the material of the removed etching-resistive layer can be prevented. The alkali solution is not directly used to remove the etching resistive layer although the solution is used to swell the etching-resistive layer. Therefore, mixing of the material of the etching-resistive layer in the alkali solution can be reduced, and reuse of the alkali solution can be easily achieved.

BRIEF DESCRIPTION OF THE DRAWINGS

FIGS. 4A to 4J are sectional views showing steps in manufacturing a shadow mask according to one embodiment of the present invention.

DETAILED DESCRIPTION OF THE PREFERRED EMBODIMENTS

Figure 1:
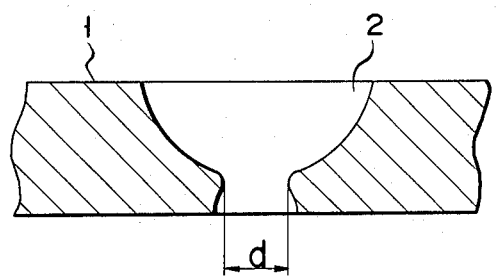
FIG. 1 is a sectional view showing the main part of a shadow mask.
Figure 2A:
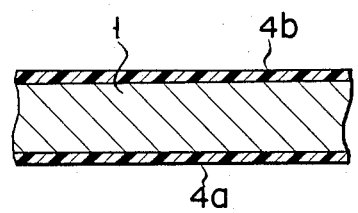
FIGS. 2A to 2E are sectional views showing steps in manufacturing a conventional shadow mask.
Figure 2B:
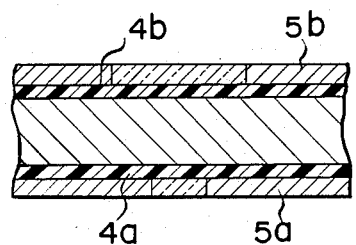
Figure 2C:
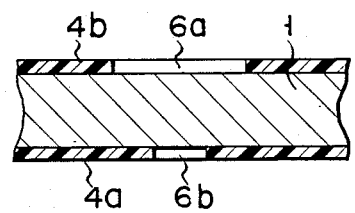
Figure 2D:
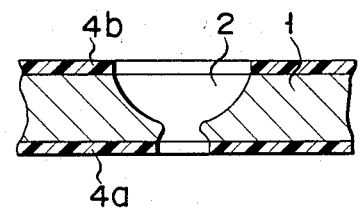
Figure 2E:
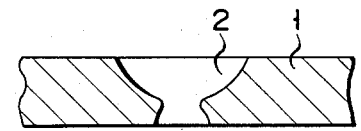
Figure 3A:
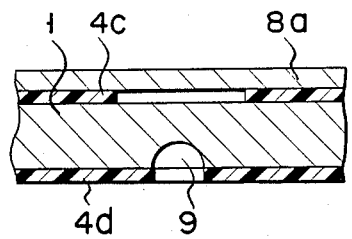
FIGS. 3A to 3F are sectional views showing steps in manufacturing another conventional shadow mask.
Figure 3B:
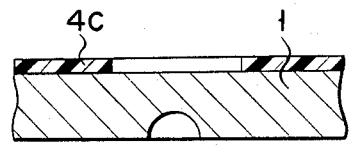
Figure 3C:
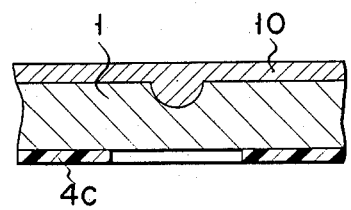
Figure 3D:
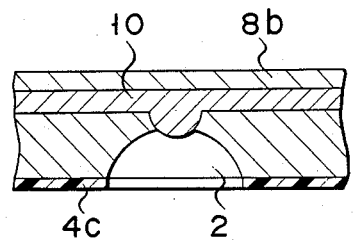
Figure 3E:
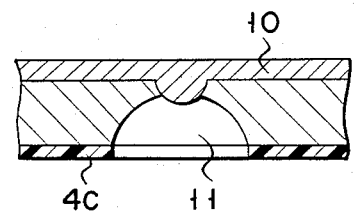
Figure 3F:
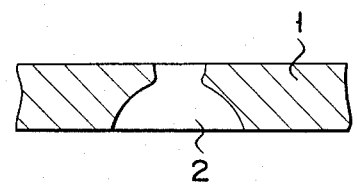

A preferred embodiment of the present invention will be described in detail with reference to the accompanying drawings.

FIGS. 4A to 4J are sectional views showing steps in manufacturing a shadow mask according to the preferred embodiment of the present invention.

As shown in FIG. 4A, after both surfaces of thin metal plate 11 are cleaned, a photoresist is applied to both the surfaces and dried to form resist films 14. Negative patterns 15a and 15b corresponding to aperture patterns of the shadow mask are brought into tight contact with resist films 14, respectively, as shown in FIG. 4B. Resist films 14 are exposed with light through corresponding patterns 15a and 15b. Exposed resist films 14 are developed and unsensitized portions of resist films 14 are removed, thereby forming resist patterns 14a and 14b, as shown in FIG. 4C. As a result, exposed portions 16a and 16b of thin metal plate 11 are formed. In this case, exposed portion 16a is larger than exposed portion 16b.

Protective film 18a of, e.g., a polyester resin is adhered to resist pattern 14a by a bonding agent. As shown in FIG. 4D, etching is performed by spraying an etching solution while resist pattern 14b faces down. Small recess 19 is formed at a position of exposed portion 16b (first etching).

Figure 4F:
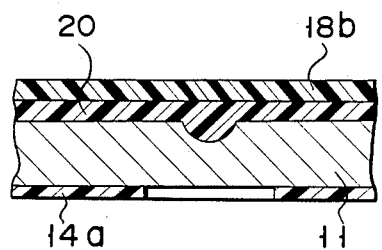
Figure 4G:
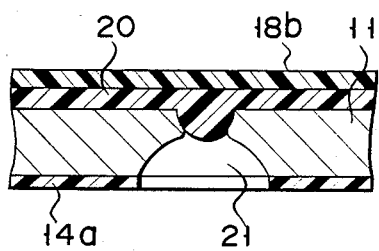

The resultant structure is washed with water, and NaOH is sprayed to remove resist pattern 14b, as shown in FIG. 4D. The resultant structure is washed with water and dried. Protective film 18a is peeled by winding machine. As shown in FIG. 4F, epoxy resin is coated so as to fill small recess 19 on the surface of thin metal plate 11 from which resist pattern 14b is removed, thus forming etching-resistive layer 20. Protective film 18b similar to protective film 18a is adhered to the surface of etching-resistive layer 20 by a bonding agent. Thereafter, as shown in FIG. 4G, an etching solution is sprayed to etch thin metal plate 11 while resist pattern 14a faces down. Large recess 21 communicating with small recess 19 is formed at a position corresponding to exposed portion 16 (second etching).

Figure 4H:
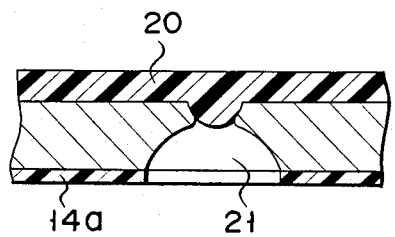

The resultant structure is then washed with water, and protective film 18b is removed, as shown in FIG. 4H, in the same manner as for protective film 18a.

Figure 4I:
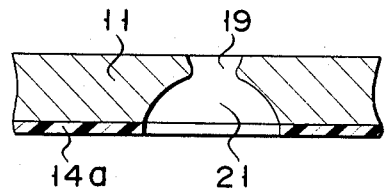

The above steps are substantially the same as those of conventional two-step etching. The subsequent steps are however different from those of conventional two-step etching. In two-step etching according to the present invention, an alkali solution such as an NaOH solution is sprayed to etching-resistive layer 20 so as to swell it. Warm water is sprayed to swelled etching-resistive layer 20 to remove it, as shown in FIG. 4I. Since etching-resistive layer 20 is floating by swelling, layer 20 can be easily removed as if it is blown by sprayed warm water.

The concentration of the NaOH solution used in swelling of etching-resistive layer 20 was about 8.5 wt %, and its temperature was 90° C. A spraying pressure was 0.8 kg/cm². The temperature of warm water used for removing etching-resistive layer 20 was 40° C., and its spraying pressure was 2 kg/cm². Spraying of warm water is preferably performed at an inclined angle with respect to the surface of etching-resistive layer 20.

Figure 4J:
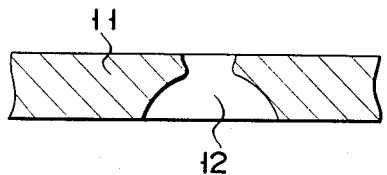

NaOH is then sprayed to remove resist pattern 14a. The resultant structure is washed with water and dried to prepare a shadow mask having aperture 12, as shown in FIG. 4J.

Figure 5:
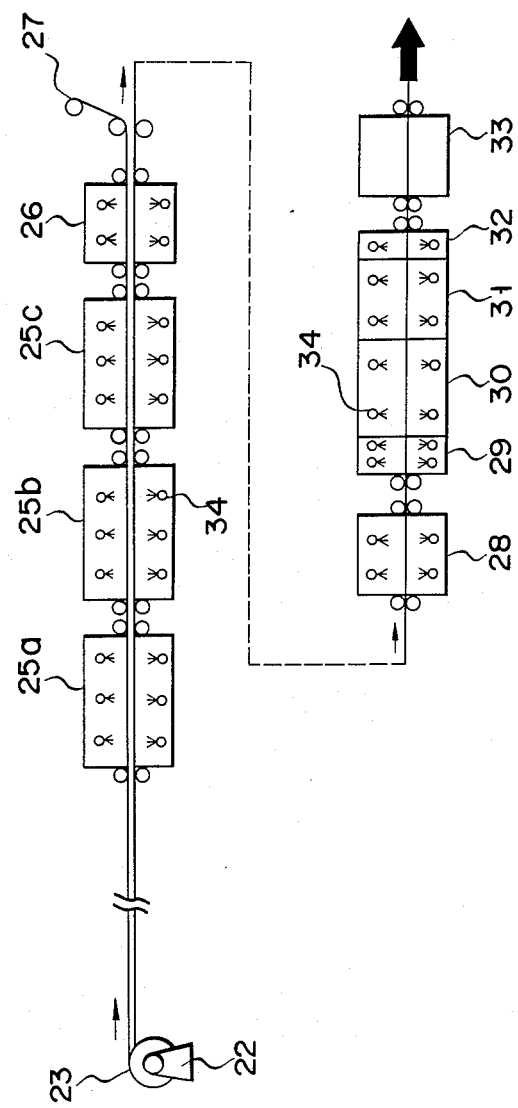
FIG. 5 is a view showing an apparatus for manufacturing the shadow mask of the embodiment.

FIG. 5 is a view showing an apparatus for practicing the steps shown in FIGS. 4D to 4J. This apparatus comprises unwinder 23 for supporting coiled thin metal hoop 22, three second etching chambers 25a, 25b, and 25c washing chamber 26 (these chambers are sequentially arranged in an unwinding direction of the hoop from unwinder 23), protective film winding means 27, alkali-treating chamber 28 for swelling etching-resistive layer 20, warm water treating chamber 29 for removing swelled etching-resistive layer 20, resist pattern removing chamber 30, washing chamber 31, pure water washing chamber 32, and drying chamber 33. Although a first etching chamber, a washing chamber, a resist pattern removing chamber, and the like are arranged between unwinder 23 and second etching chamber 25, they are omitted from FIG. 5. Spraying nozzles 34 are disposed in all chambers except for drying chamber 33. Predetermined solutions compressed by a pump are supplied from tanks (not shown) for storing these solutions to spraying nozzles 34.

In the apparatus described above, alkali-treating chamber 28 for swelling etching-resistive layer 20 and resist pattern removing chamber 30 are separately arranged, and an alkali solution is supplied from corresponding chambers to chambers 28 and 30.

Hoop 22 having resist patterns 14a and 14b and protective film 18a are unwound by unwinder 23 in a direction of an arrow is subjected to first etching in first etching chamber. Thereafter, resist pattern 14b and protective film 18a are removed, and hoop 22 having etching-resistive layer 20 and protective film 18b is fed to second etching chambers 25a, 25b, and 25c while resist pattern 14a faces down. The surface having resist pattern 14a is etched. Hoop 22 is washed in washing chamber 26 and protective film 18b is taken up by protective film winding means 27. Thereafter, hoop 22 is treated in chambers 28 to 33, thereby preparing a predetermined shadow mask.

In the apparatus described above, since the highly viscous etching-resistive layer is swelled by an alkali treatment in alkali-treating chamber 28, swelled etching-resistive layer 20 can be easily and properly removed by spraying of warm water in warm water treating chamber 29.

The above apparatus comprises alkali-treating chamber 28 and resist pattern removing chamber 30. Etching-resistive layer 20 and the resist pattern are removed in separate chambers. For this reason, the viscous material of etching-resistive layer 20 is not mixed in the alkali solution tank used for removing the resist pattern. As a result, clogging of the aperture can be prevented. As the material of etching-resistive layer 20 is not mixed in the alkali solution tank, the alkali solution can be easily reused.

What is claimed is:

1. A method of manufacturing a shadow mask, comprising the steps of: forming a first resist pattern having a large number of openings on one major surface of a thin metal plate and a second resist pattern on the other major surface, the second resist pattern having a large number of openings with an opening size different from that of the first resist pattern; etching the thin metal plate surface having the first resist pattern to form first recesses; removing the first resist pattern; forming an etching-resistive layer on the thin metal plate surface having the first recesses; etching the thin metal plate surface having the second resist pattern to form second recesses which have a size different from that of the first recesses and communicate with the first recesses; treating and swelling the etching-resistive layer with an alkali solution; spraying warm water to the etching-resistive layer to remove the etching-resistive layer; and removing the second resist pattern.

2. A method according to claim 1, wherein the etching-resistive layer is made of a material selected from the group consisting of epoxy resin, acrylic resin and a photoresist.

3. A method according to claim 1, wherein the alkali solution for swelling the etching-resistive layer is a solution selected from the group consisting of an NaOH solution, NaOH solution containing a surfactant, and NaOH solution containing an inhibitor.

4. A method according to claim 1, wherein a temperature of the alkali solution falls within a range of 80° to 110° C.

5. A method according to claim 1, wherein a temperature of the alkali solution falls within a range of 88° to 98° C.

6. A method according to claim 1, wherein a pressure of the alkali solution applied to the etching-resistive layer is not more than 1.5 kg/cm$^2$.

7. A method according to claim 1 wherein a pressure of the alkali solution applied to the etching-resistive layer falls within a range of 0.5 to 1.0 kg/cm$^2$.

8. A method according to claim 1, wherein a temperature of warm water for removing the etching resistive layer falls within a range of 20° to 70° C.

9. A method according to claim 1, wherein a temperature of warm water for removing the etching-resistive layer falls within a range of 30° to 50° C.

10. A method according to claim 1, wherein a pressure of warm water sprayed to the etching-resistive layer falls within a range of 0.5 to 3 kg/cm$^2$.

11. A method according to claim 1, wherein a pressure of warm water sprayed to the etching-resistive layer falls within a range of 1.0 to 2.0 kg/cm$^2$.

12. A method according to claim 1, wherein the first recess is smaller than the second recess.

13. A method according to claim 1, wherein swelling and removal of the etching-resistive layer are performed in a chamber independent of a chamber for removing the second resist pattern.

14. A method according to claim 1, wherein warm water is obliquely sprayed with respect to a surface of the etching-resistive layer.

15. An apparatus for manufacturing a shadow mask, comprising: means for etching one major surface of a thin metal plate, the thin metal plate being prepared such that a first resist pattern having a large number of openings is formed on said one major surface and that a second resist pattern having a large number of openings with an opening size different from that of the first resist pattern is formed on the other major surface of the thin metal plate; means for etching said one major surface of the thin metal plate with the etched surface on which an etching-resistive layer is formed; means for treating the etching-resistive layer with an alkali solution to swell the etching-resistive layer; means for spraying warm water to the etching-resistive layer to remove the etching-resistive layer; and means for removing the second resist pattern.

* * * * *